(12) United States Patent
Marra et al.

(10) Patent No.: US 6,893,101 B2
(45) Date of Patent: May 17, 2005

(54) ACTIVE ELEMENT BIAS CIRCUIT FOR RF POWER TRANSISTOR INPUT

(75) Inventors: Thomas Marra, San Diego, CA (US); Lennart Mathe, San Diego, CA (US)

(73) Assignee: Telefonaktiebolaget L.M. Ericsson (SE)

(*) Notice: Subject to any disclaimer, the term of this patent is extended or adjusted under 35 U.S.C. 154(b) by 301 days.

(21) Appl. No.: 09/917,573

(22) Filed: Jul. 27, 2001

(65) Prior Publication Data
US 2003/0020546 A1 Jan. 30, 2003

(51) Int. Cl.$^7$ ................................................ H03F 3/04
(52) U.S. Cl. ...................... 300/296; 330/285; 330/133
(58) Field of Search ............................... 330/285, 296, 330/133

(56) References Cited

U.S. PATENT DOCUMENTS

| | | | | |
|---|---|---|---|---|
| 4,107,621 A | * | 8/1978 | Furutani et al. | 330/296 |
| 4,123,722 A | * | 10/1978 | Cubbison, Jr. | 330/85 |
| 4,320,352 A | * | 3/1982 | Rubin et al. | 330/277 |
| 4,320,353 A | | 3/1982 | Sasaki | |
| 4,859,965 A | | 8/1989 | Paolella et al. | 330/285 |
| 5,432,473 A | | 7/1995 | Pakonen et al. | 330/133 |
| 6,018,270 A | | 1/2000 | Brogan et al. | 330/278 |
| 6,215,358 B1 | | 4/2001 | Hon et al. | 330/289 |

FOREIGN PATENT DOCUMENTS

| | | |
|---|---|---|
| GB | 2276288 | 9/1994 |
| JP | 54005366 | * 1/1979 |
| JP | 1079515 | 2/2001 |
| JP | 1128548 | 8/2001 |
| WO | WO 0128086 | 4/2001 |

OTHER PUBLICATIONS

Yu et al. An Automatic Offset Compensation Scheme with Ping–Pong control for CMOS Operational Amplifiers, IEEE Journal of Solid–State Circuits vol. 29 Issue 5 May 1994 pp 601–610.*

Millman "Micro–Electronics Digital and Analog Circuits and Systems" McGraw–Hill Copyright 1979 pp 523–527.*

* cited by examiner

Primary Examiner—Michael B Shingleton
(74) Attorney, Agent, or Firm—Coats & Bennett, P.L.L.C.

(57) ABSTRACT

A biasing circuit for biasing a device (e.g., a GaAs field effect transistor) used for amplifying a radio frequency (RF) signal, the biasing circuit including an active element in series with a resistor, the active element providing a relatively low impedance over a bandwidth comparable to an amplitude modulation bandwidth of the RF signal, such that a DC bias voltage applied at the active element has a fixed DC voltage at the resistor input, i.e., without any memory effect, thereby allowing for improved predistortion compensation of non-linear voltage of the RF signal.

15 Claims, 3 Drawing Sheets

ACTIVE ELEMENT BIAS CIRCUIT FOR RF POWER TRANSISTOR INPUT

FIELD OF THE INVENTION

The present invention pertains generally to the field of radio frequency (RF) amplifier devices and, more specifically, to techniques for direct current (DC) biasing the input of a transistor used for amplifying a RF signal without incurring memory effect problems. By way of non-limiting example, the invention relates to RF power amplification circuits in wireless communication devices and networks.

BACKGROUND OF THE INVENTION

The use of transistor devices as signal amplifiers in wireless communication applications is well known. With the considerable recent growth in the demand for wireless services, such as personal communication services, the operating frequency of wireless networks has increased dramatically and is now well into the gigahertz (GHz) frequencies. At such high frequencies, Gallium Arsenide field effect transistors (GaAs FETs) have been preferred for power amplification applications, such as, e.g., use in mobile communication devices to provide power amplification for RF signals. In particular, GaAs FETs have a relatively high saturation power efficiency at frequencies of a few gigahertz, e.g., at 2 GHZ.

When a GaAs FET is operated as a common source amplifier, such as in a metal-semiconductor field effect transistor (MESFET), the transistor gate is supplied with both the RF input signal to be amplified, as well as a DC bias voltage. Since the gate of a GaAs FET is a Shottky barrier, the relatively strong RF input signal power will rectify the Shottky barrier and generate high positive gate current, which can destroy the transistor device. As a result, the DC bias supply circuitry is conventionally designed to prevent a high gate current.

By way of illustration, FIG. 1 illustrates a conventional power amplifier circuit 10 for amplifying a RF input signal, designated as "$RF_{IN}$," with the amplified output signal designated as "$RF_{OUT}$." The amplifier 10 includes a GaAs FET 15 operated as a common-source amplifier, with the input signal $RF_{IN}$ applied to the gate terminal, the output signal $RF_{OUT}$ received off the drain terminal, and the source terminal providing a relative ground for the common element current path. The amplifier 10 further comprises a gate bias circuit 20 for coupling a DC source 35 to the gate terminal of the GaAs FET 15. A DC blocking capacitor 25 is used in a conventional fashion to prevent the DC voltage from source 35 from passing upstream along the $RF_{IN}$ signal path.

Within the gate bias circuit 20, the gate bias voltage from the DC source 35 is coupled to the gate of the GaAs FET 15 via a series connected, current limiting resistor 30. In particular, when a high gate current is generated by the $RF_{IN}$ signal, the current will create a voltage drop between the gate and the DC source 35 across the resistor 30 and, thus, lower the gate current. The resistor 30 acts like a negative feedback to control the gate current and, thus, protect the transistor device 15. By way of further illustration, FIG. 2 is a graph of an exemplary gate current $I_G$ versus power of the RF input signal $RF_{IN}$ if the signal were connected directly to the bias voltage source 35 without the resistor 30. When the power of the RF input signal $RF_{IN}$ is relatively low, the inherent body Shottky diode of the gate of the GaAs FET 15 is reversed biased and the gate current $I_G$ is very small. As the power of the RF input signal $RF_{IN}$ is increased, the gate current $I_G$ increases in the negative direction from the drain to gate. This negative gate current $I_G$ is caused by drain-to-gate breakdown of the GaAs FET 15. As the power of the RF input signal $RF_{IN}$ is further increased, the gate Shottky diode is rectified, i.e., forward biased, causing the gate current $I_G$ to rapidly increase in the positive direction from the gate to the source. Heat generated by this positive gate current $I_G$, if allowed to increase unchecked, can destroy the GaAs FET device 15. Thus, the resistor 30 limits high positive gate current by producing a voltage drop between the voltage bias source 35 and the gate of the GaAs FET 15 when positive gate current flows through the resistor 30.

Returning to the amplifier 10 in FIG. 1, a relatively large value capacitor 40 is connected to ground between the DC voltage source 35 and the resistor 30 to create a ground path for the gate current. A shunt inductance 45 is coupled between the resistor 30 and the transistor gate to prevent the RF input signal $RF_{IN}$ from flowing through the capacitor 40. In the illustrated embodiment, the shunt inductance 45 comprises a quarter-wavelength (¼ λ) stub, where λ is the wavelength of the fundamental carrier frequency $f_0$ of the RF input signal, e.g., 2 GHz, in parallel with a relatively small bypass capacitor 50 shorted to ground. The ¼ λ stub appears as a short circuit to the RF input signal $RF_{IN}$, while providing a low (essentially purely resistive) impedance path for the DC bias voltage source 35. The bypass capacitor 50 provides a short to ground for the $RF_{IN}$ signal and an open circuit for the voltage bias source 35, and is invisible to the gate current of the GaAs FET 15. Therefore, the ¼ λ stub 45 passes the voltage bias source 35 to the gate terminal of the GaAs FET 15, while blocking the RF input signal $RF_{IN}$ from entering the gate bias circuit 20. Alternately, a RF choke could be used instead of the ¼ λ stub for providing the shunt inductance 45.

Notably, the voltage drop across the resistor 30 varies the gate bias voltage when there is positive gate current. This variation in the gate bias voltage varies the bias condition of the amplifier 10, which impacts the amplifier's performance, e.g., gain, output power, impedance matching, etc. It would be desirable to correct for this non-linear distortion by using known predistortion techniques. However, because the RF input signal $RF_{IN}$ is typically amplitude modulated, a time-varying amplitude envelope is impressed on the RF input signal. When this time-varying amplitude is large enough to forward bias the Shottky diode of the gate of the GaAs FET 15, positive gate current is produced. The variation in the gate bias voltage will depend not only on the instantaneous gate current, but on the history of the gate current leading up to the instantaneous gate current, as well. This phenomenon, commonly known as a "memory effect," is caused by the voltage bias capacitor 40 forming a RC circuit with resistor 30, which limits the response time of the gate voltage circuit 20 to changes in the gate current. When the frequency of the gate current exceeds $1/(2\pi RC)$, the gate bias circuit 20 can not change the gate bias voltage fast enough to follow instantaneous changes in the gate current. As such, the ability of predistortion to correct the distortion of the RF output signal caused by the variation in the gate bias voltage in conventional RF amplifier circuits is limited.

SUMMARY OF THE INVENTION

In accordance with a first aspect of the invention, a circuit is provided for gate biasing a transistor used for amplifying an RF signal in a wireless communication device, a handset or radio base station.

In one embodiment, the bias circuit includes an active element in series with a resistor in a DC bias circuit. The active element provides a relatively low impedance over a bandwidth comparable to an amplitude modulation bandwidth of the RF signal, such that a DC bias voltage applied at the active element has a fixed DC voltage at the resistor input, i.e., without any memory effect, thereby allowing for improved predistortion compensation.

Other aspects and features of the present invention will become apparent from consideration of the following description made in conjunction with the accompanying drawings of a preferred embodiment.

BRIEF DESCRIPTION OF THE DRAWINGS

The drawings illustrate both the design and utility of a preferred embodiment of the invention, presented in contrast with a prior art embodiment for better illustration, wherein.

DETAILED DESCRIPTION OF THE PREFERRED EMBODIMENT

In accordance with the a general aspect of the invention, the passive capacitor used for providing a ground path for the gate current in conjunction with the current limiting resistor in conventional gate biasing circuits (e.g., capacitor 40 in the gate biasing circuit 20 of FIG. 1) is replaced with an active circuit element which provides a low output impedance over the operating frequency bandwidth of the RF input signal. In this manner, the gate current will see only a purely resistive load throughout the signal frequency bandwidth, without also further introducing unwanted memory effect into the biasing circuit.

Importantly, while the concepts and advantages of the invention will now be described in accordance with an embodiment directed to gate biasing of a GaAs FET, the invention may be equally employed in biasing circuits for other RF devices having drive dependent gate currents. By way of non-limiting examples, devices such as a GaAs pHEMT may also have drive dependent gate currents. Although bi-polar transistors do not have gates, and instead receive the RF input signal at their base (with a common emitter configuration), or emitter (with a common base configuration), they still require DC input biasing and have the same current limiting resistor configuration as the GaAs FET embodiments described herein. Further devices that may be used in RF amplifier circuits include heterojunction bi-polar transistors ("HBTs") which do not have a gate per se, but still require DC biasing of the RF input signal and can benefit by employing an active element in conjunction with a current limiting resistor to prevent memory effect in the biasing circuit. Thus, the invention is not limited to gate biasing circuits, per se.

Figure 3:
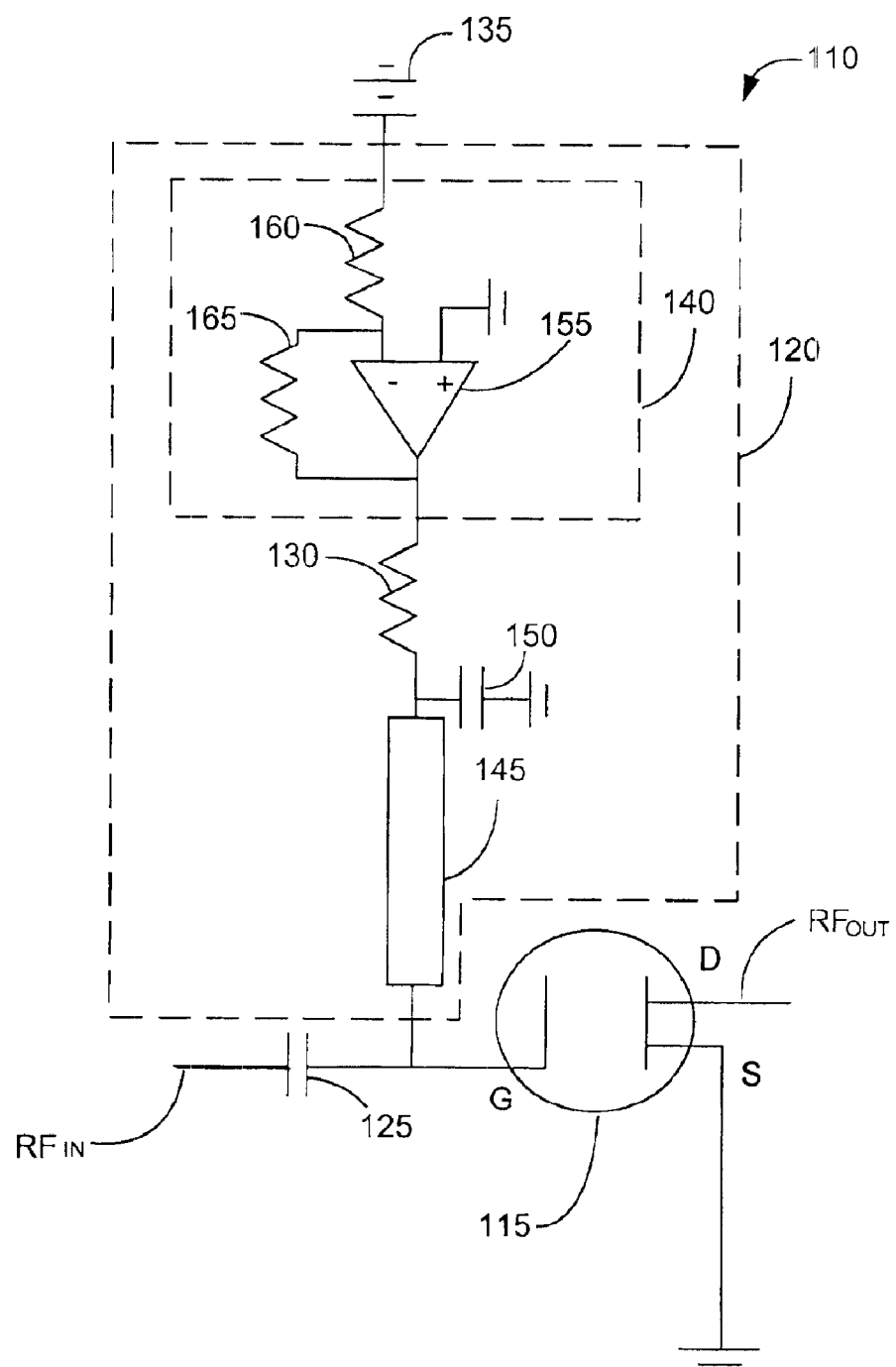
FIG. 3 is a circuit schematic diagram of a power amplifier according to one embodiment of the invention.

FIG. 3 shows a circuit schematic of a RF amplifier circuit 110 constructed in accordance with one embodiment of the invention. The amplifier 110 includes a GaAs FET 115 operated as a common-source amplifier, with the input signal $RF_{IN}$ applied to the gate terminal, the output signal $RF_{OUT}$ received off the drain terminal, and the source terminal providing a relative ground for the common element current path. The amplifier 110 further comprises a gate bias circuit 120 for coupling a DC source 135 to the gate terminal of the GaAs FET 115. A DC blocking capacitor 125 is used in a conventional fashion to prevent the DC voltage from source 35 from passing upstream along the $RF_{IN}$ signal path.

Figure 1:
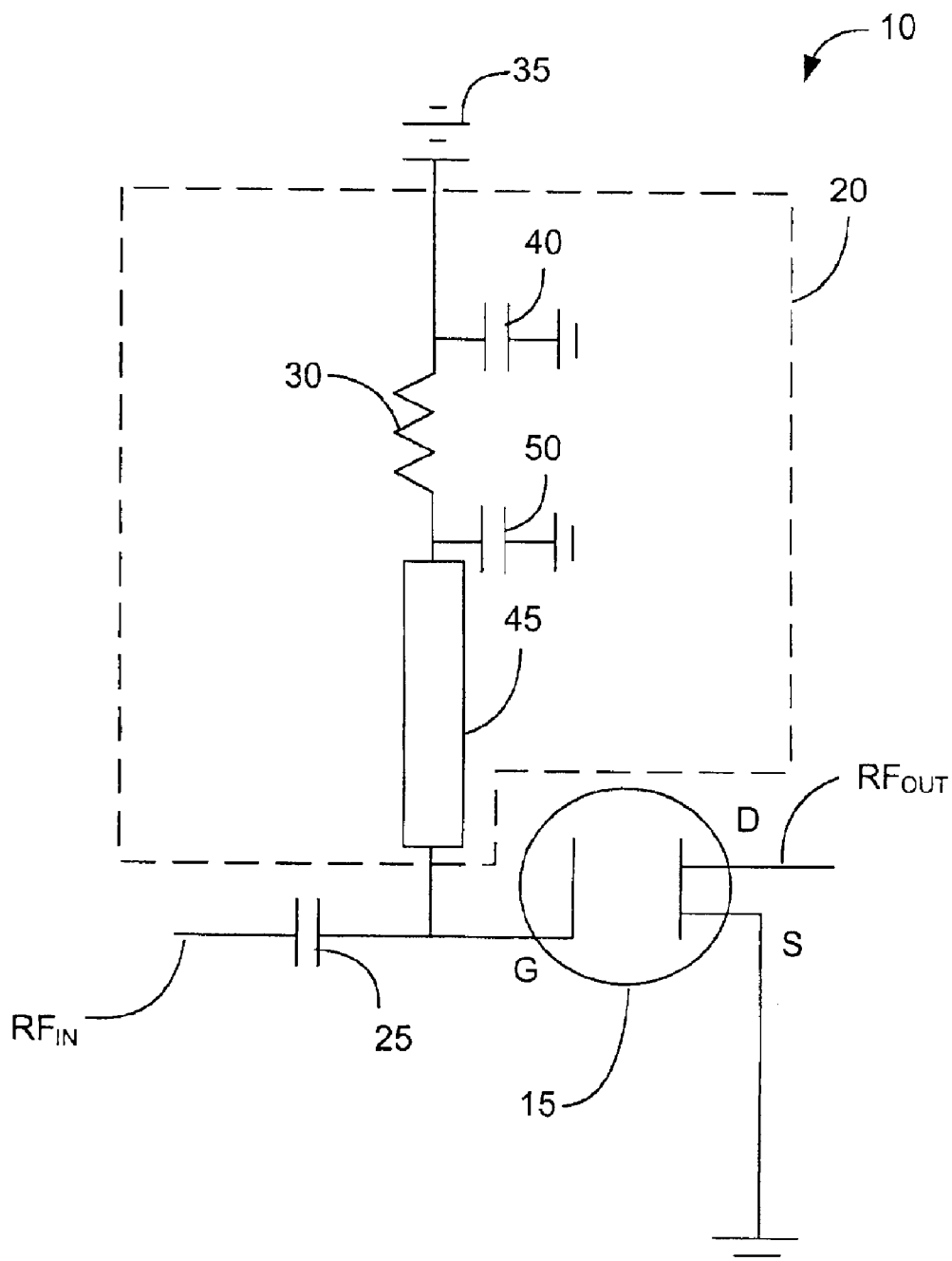
FIG. 1 is a circuit schematic diagram of a conventional power amplifier.
Figure 2:
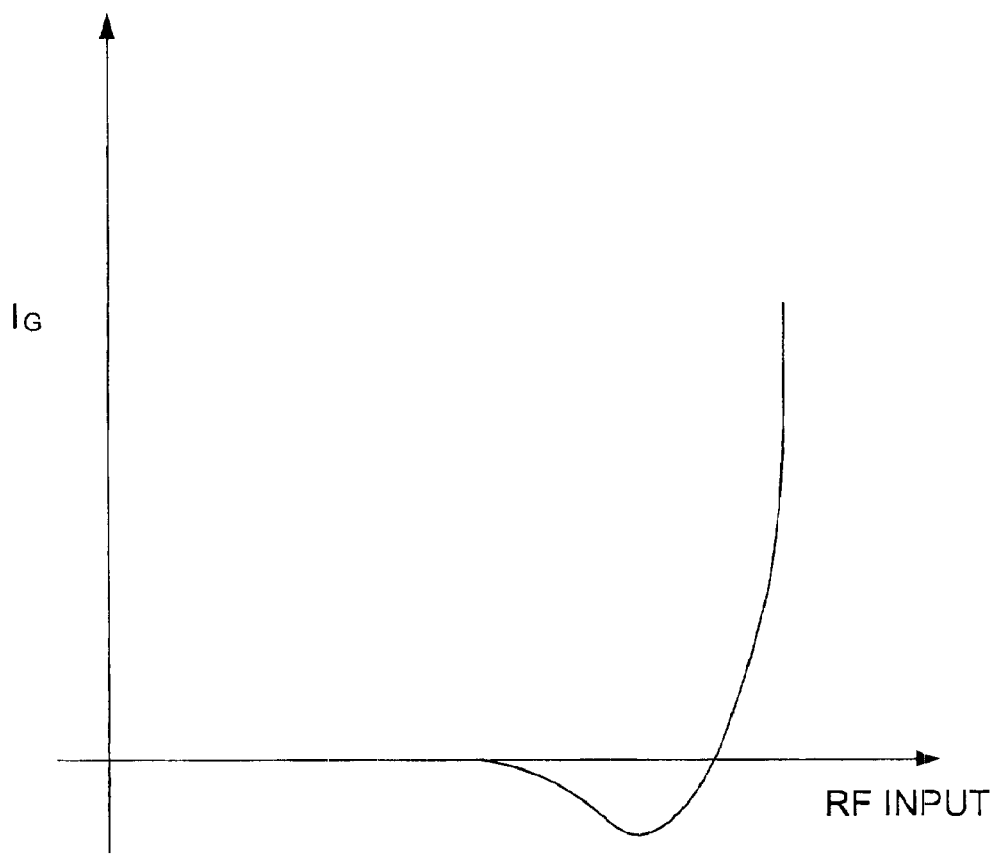
FIG. 2 is a graph showing the gate current of a GaAs FET versus power level of an RF input signal in a power amplifier circuit without a gate current limiting resistor.

As in the conventional gate bias circuit 20 of amplifier circuit 10 in FIG. 1, the gate bias voltage from the DC source 135 is coupled to the gate of the GaAs FET 115 via a series connected, current limiting resistor 130, which provides a negative feedback to control the gate current and, thus, protect the transistor device 115. As also in the conventional gate bias circuit 20, a shunt inductance 145 and bypass capacitor 150 are coupled between the resistor 130 and the gate of transistor 115 to short circuit the RF input signal $RF_{IN}$, while providing a low (essentially purely resistive) impedance path for the DC bias voltage source 135. The shunt inductance 145, which may comprise a quarter-wavelength (¼ λ) stub, or alternatively, an RF choke, passes the DC voltage from source 135 to the gate of the GaAs FET 115, while blocking the RF input signal $RF_{IN}$ from entering the gate bias circuit 120.

In accordance with the invention, the passive voltage bias capacitor 40 of conventional biasing circuit 20 is replaced in circuit 120 with an active element 140 connected in series between the voltage bias source 135 and the current limiting resistor 130. In the illustrated embodiment, the active element circuit 140 comprises an operational amplifier (op amp) 155 having a negative input terminal, a positive input terminal and a single-ended output. A first resistor 160 is connected between the voltage bias source 135 and the negative input terminal of the op amp 155, and a second resistor 165 is connected between the negative input terminal and the output of the op amp 155. The positive input terminal of the op amp 155 is connected to ground and the output is connected to the current limiting resistor 130.

The op amp 155 preferably has high internal impedance at its two input terminals so that negligible current flows into the negative input terminal from the voltage bias source 135. That way, almost all of the current passing through resistor 160 from the voltage bias source 135 also flows through resistors 165 and 130. In addition, the op amp 155, preferably, has a relative low output impedance and a high gain. The arrangement of resistor 160 ("R1"), resistor 165 ("R2"), and the op amp 155 forms an inverting amplifier circuit having an output voltage, $V_{out}$ approximately equal to $$V_{out} = -(R2/R1)*V_{bias}$$

where $V_{bias}$ is the voltage of the voltage bias source 135. This approximation is good when the gain of the op amp 155 is a few orders of magnitude larger than R2/R1. When negligible current flows through the resistor 130, the gate bias voltage at the gate of transistor 115 is approximately equal to the output voltage $V_{out}$ of the active element circuit 140. The actual value of resistors 160 and 165 are dependent on the desired operating characteristics of the amplifier circuit 110. For example, when resistors 160 and 165 have equal resistance, a gate voltage bias of −1.5V can be achieved by using a bias voltage $V_{bias}$ of 1.5V.

The op amp 155 preferably has a frequency bandwidth that at least encompasses the bandwidth of the gate current of the transistor 115, such that that the output impedance of the op amp 155 remains purely resistive throughout the bandwidth of the gate current. For example, for a gate current bandwidth of DC to 10 MHz, the op amp 155 can have a bandwidth of DC to 30 MHz. This way, the output impedance of the gate bias circuit 120 seen at the gate of transistor 115 is purely resistive throughout the bandwidth of the gate current. As a result, the variation in the gate bias voltage produced by the gate bias circuit 120 only depends on the instantaneous gate current, without the undesirable memory effect associated with the voltage bias capacitor 40 of the prior art biasing circuit 20. This enables the distortion in the RF output signal caused by the variation in the gate bias current to be corrected using known predistortion techniques.

While various embodiments of the application have been described, it will be apparent to those of ordinary skill in the art that many embodiments and implementations are possible that are within the scope of the present invention.

For example, the op amp 155 and resistors 160 and 165 of the active element circuit 140 may be arranged to form a non-inverting amplifier, instead of the inverting amplifier. Notably, in alternate embodiments, the active element circuit 140 may comprise different circuit components, while still providing relatively low output impedance throughout the bandwidth of the gate current of transistor 115. By way of one example, the op amp 155 may be replaced by a suitable arrangement of transistors.

Therefore, the invention is not to be restricted or limited except in accordance with the following claims and their equivalents.

What is claimed is:

1. A radio frequency (RF) amplifier circuit comprising a RF device to amplify a RF signal comprising an amplitude-modulated carrier having an amplitude modulation bandwidth, and a bias circuit to bias the RF device, said bias circuit comprising:

a bias amplifier to generate a low-impedance bias signal at a bias amplifier output based on a bias reference voltage input to the bias amplifier;

a bias current-limiting resistor coupled to the bias amplifier output;

a reactive circuit having a first terminal coupled to the bias current-limiting resistor and a second terminal coupled to a bias input of the RF device, said reactive circuit configured to substantially block the RF signal from the bias circuit while simultaneously passing the bias signal from the bias circuit to the RF device; and said bias amplifier comprising an operational amplifier configured to have a desired gain relative to the bias reference voltage and further configured to have an output bandwidth enabling it to quash signal disturbances feeding back from the bias input of the RF device that are not blocked by the reactive circuit and thereby maintain a fixed bias voltage at the bias amplifier output.

2. The RF amplifier circuit of claim 1, wherein the RF device comprises a field-effect transistor (FET) device and the bias input comprises a gate input of the FET device to which the RF signal is applied, and wherein the signal disturbances arise from unwanted demodulation of the amplitude-modulated carrier by the FET device.

3. The RF amplifier circuit of claim 2, wherein the gate input is ac-coupled to the RF signal via an input capacitor and low-pass coupled to the bias amplifier via the reactive circuit.

4. The RF amplifier circuit of claim 1, wherein the RF device comprises a GaAs FET operated as a common-source amplifier, and wherein the bias current-limiting resistor is sized to limit gate current of the GaAs FET to a desired maximum value.

5. The RF amplifier circuit of claim 1, wherein the bias amplifier comprises an inverting amplifier having a desired gain relative to the bias reference voltage.

6. The RF amplifier circuit of claim 1, wherein the bias amplifier comprises a buffer amplifier to provide a low-impedance voltage source at the bias reference voltage.

7. The RF amplifier circuit of claim 1, wherein the reactive circuit comprises a ¼ wavelength stub with respect to the RF signal input to the RF device.

8. The RF amplifier circuit of claim 1, wherein the reactive circuit comprises a low-pass filter (LPF) circuit that includes an inductor in series with the bias current-limiting resistor and a shunt capacitor having a first terminal coupled to a node connecting the bias current-limiting resistor to the inductor and a second terminal coupled to a signal ground connection.

9. The RF amplifier circuit of claim 8, wherein the inductor comprises a RF choke.

10. A bias circuit to provide gate bias to a RF transistor, the bias circuit comprising:

an operational amplifier circuit to provide a low-impedance reference voltage at an output of the operational amplifier circuit;

a current-limiting resistor coupled in series with the output of the operational amplifier circuit to limit bias current into a gate of the RF transistor; and a RF filter circuit to couple the current-limiting resistor to the gate of the RF transistor, said RF filter circuit configured to block RF input signals applied to the gate from the bias circuit; and said operational amplifier circuit configured to have an output bandwidth enabling it to quash signal disturbances fed back from the gate of the RF transistor over a range of frequencies not blocked by the RF filter circuit and thereby maintain the reference voltage at a substantially fixed value.

11. The bias circuit of claim 10, wherein the RF filter circuit comprises an inductor coupled at one end to the gate of the RF transistor and coupled at the other end to the current-limiting resistor, such that the bias circuit is coupled to the gate of the RF transistor through the inductor.

12. The bias circuit of claim 11, further comprising a shunt capacitor coupled to a node connecting the current-limiting resistor and the inductor.

13. The bias circuit of claim 10, wherein the RF filter circuit comprises a RF choke placed in series with the current-limiting resistor, such that the bias circuit is coupled to the gate of the RF transistor through the RF choke.

14. The bias circuit of claim 13, further comprising a shunt capacitor placed at a node connecting the current-limiting resistor and the RF choke.

15. The bias circuit of claim 10, wherein the RF filter circuit comprises a quarter-wavelength stub at a RF input signal frequency.

* * * * *

UNITED STATES PATENT AND TRADEMARK OFFICE
CERTIFICATE OF CORRECTION

PATENT NO. : 6,893,101 B2 Page 1 of 1
APPLICATION NO. : 09/917573
DATED : May 17, 2005
INVENTOR(S) : Marra et al.

It is certified that error appears in the above-identified patent and that said Letters Patent is hereby corrected as shown below:

Title Page, in Field (56), under "FOREIGN PATENT DOCUMENTS", in Column 2, Line 3, delete "JP   1079515   2/2001" and insert -- EP   1079515   2/2001 --, therefor.

Title Page, in Field (56), under "FOREIGN PATENT DOCUMENTS", in Column 2, Line 4, delete "JP   1128548   8/2001" and insert -- EP   1128548   8/2001 --, therefor.

In Column 3, Line 28, after "the" delete "a".

Signed and Sealed this

Twenty-fifth Day of March, 2008

JON W. DUDAS
*Director of the United States Patent and Trademark Office*